United States Patent [19]
Hur

[11] Patent Number: 5,952,872
[45] Date of Patent: Sep. 14, 1999

[54] INPUT/OUTPUT VOLTAGE DETECTION TYPE SUBSTRATE VOLTAGE GENERATION CIRCUIT

[75] Inventor: Young-Do Hur, Choongcheongbuk-Do, Rep. of Korea

[73] Assignee: LG Semicon Co., Ltd., Cheongju, Rep. of Korea

[21] Appl. No.: 09/045,942

[22] Filed: Mar. 23, 1998

[30] Foreign Application Priority Data

Apr. 22, 1997 [KR] Rep. of Korea ................... 97-14968

[51] Int. Cl.$^6$ ........................................ G05F 1/10
[52] U.S. Cl. .............................. 327/535; 327/537
[58] Field of Search .................... 327/546, 547, 327/365, 535, 537; 365/226, 227, 228; 307/110

[56] References Cited

U.S. PATENT DOCUMENTS

| | | | |
|---|---|---|---|
| 5,483,486 | 1/1996 | Javanifard et al. | 365/185.17 |
| 5,672,996 | 9/1997 | Pyeon | 327/534 |
| 5,673,232 | 9/1997 | Furutani | 365/226 |
| 5,687,128 | 11/1997 | Lee et al. | 365/226 |

*Primary Examiner*—Terry D. Cunningham
*Assistant Examiner*—Maria Hasanzadah
*Attorney, Agent, or Firm*—Fleshner & Kim

[57] ABSTRACT

An input/output voltage detection type substrate voltage generation circuit that of effectively prevents the electric potential of the substrate from being increased by varying the driving capability of a substrate voltage generation circuit. The input/output voltage detection type substrate voltage generation circuit preferably varies the driving capability by detecting an input electric potential of a data input/output terminal. The circuit includes a variable period type oscillator for receiving first, second and third signals as inputs to varying periods of the oscillator and a charge pump for pumping an electric charge to the substrate in accordance with a driving signal output from the variable period type oscillator and based on the variable period of the oscillator.

20 Claims, 4 Drawing Sheets

INPUT/OUTPUT VOLTAGE DETECTION TYPE SUBSTRATE VOLTAGE GENERATION CIRCUIT

BACKGROUND OF THE INVENTION

1. Field of the Invention

The present invention relates to a substrate voltage generation circuit, and in particular, to an input/output voltage detection type substrate voltage generation circuit.

2. Background of the Related Art

FIG. 1 illustrates a block diagram of a related art substrate voltage generation circuit. As shown in FIG. 1, the related art substrate voltage generation circuit includes a substrate voltage sensor 10 for detecting a voltage from a substrate 40. An oscillator 20 is driven by an output of the substrate voltage sensor 10 and an external row address strobe RASB signal. A charge pump 30 is for pumping an electric charge in accordance with an output from the oscillator 20 and delivering the electric charge to the substrate 40.

FIG. 2 illustrates a schematic circuit diagram of the related art substrate voltage generation circuit. As shown in FIG. 2, the substrate voltage sensor 10 includes a PMOS transistor 11 and NMOS transistors 12 and 13, which are connected in series between a power supply voltage VCC and a substrate voltage VBB, and an inverter 14. The inverter 14 inverts the output from a common connecting node "a" between the drains of the PMOS transistor 11 and the NMOS transistor 12. The source and body regions of PMOS transistor 11 are commonly connected, as are the gate and drain of NMOS transistor 13. The gates of the PMOS transistor 11 and the NMOS transistor 12 are commonly connected to ground voltage VSS.

The oscillator 20 includes a NAND-gate 21 for NANDing the externally applied RASB signal and the output from the inverter 14 of the substrate voltage sensor 10. NAND-gates 22, 23 and 24 are coupled in cascade series with each other and each receives the output from the NAND-gate 21 as one input. Series inverters 25 and 26 sequentially invert the output from the NAND-gate 24. The output of the NAND-gate 24 is also fed back and into the other input of the NAND-gate 22.

The charge pump 30 includes a pumping PMOS transistor capacitor 31 having its body connected to VCC and having its source and drain commonly coupled to the output of inverter 26 in the oscillator 20 at a node "b". The pumping PMOS transistor capacitor 31 pumps to VCC or −VCC in accordance with a clock signal from the inverter 26 in the oscillator 20. An NMOS transistor 32 is for discharging the output from the gate of the PMOS transistor pumping capacitor 31 to a VSS node and operates as a diode. An NMOS transistor 33 transmits the pumped electric charge to a substrate voltage VBB node.

The operation of the related art substrate voltage generation circuit will now be described. First, the electric potential at the output node "a" of the substrate voltage sensor 10 is determined in accordance with the variation in the voltage VBB of the substrate as follows.

When VSS>VBB+2Vtn, the NMOS transistors 12 and 13 are turned on. In this case, VBB denotes the substrate voltage, and Vtn denotes a threshold voltage of an NMOS transistor. When enabled, the NMOS transistors 12 and 13 pass a current I1 so that the electrical potential at the output node "a" drops down below the logic threshold point of the inverter 14, and the output from the inverter 14 becomes high level. When VSS<VBB+2Vtn, the electric potential at the output node "a" is pulled up to VCC. Thus, the output from the inverter 14 becomes low level.

As shown in FIG. 3C, when the voltage VBB at the substrate is 0 V, the electrical potential at the output node "a" is pulled up to VCC as shown in FIG. 3B, and the output from the inverter 14 becomes low level. Therefore, the oscillator 20 is operated when a low level RASB signal is externally inputted or when a low level signal is outputted from the substrate voltage sensor 10 (i.e., the substrate voltage VBB increases). Therefore, the oscillator 20 outputs a pulse signal "b" having a predetermined period as shown in FIG. 3A.

The charge pump 30 pumps an electric charge in accordance with the clock signal from the node "b" in the oscillator 20. The charge pump 30 outputs the pumped electrical charge to the substrate voltage VBB node to drop the increased substrate voltage VBB.

Namely, when a VCC level clock signal is inputted from the node "b", the pumping capacitor 31 of the charge pump 30 pumps the electric potential at a node "c" up to the level of VCC. At this time, since the drain and gate of the NMOS transistor 32 are coupled to each other, the NMOS transistor 32 is turned on in accordance with the pumped voltage VCC. Therefore, the electric potential at the node "c" pumped up to VCC is discharged to the VSS node until the electric potential of the node "c" reaches the threshold voltage Vt1 of the NMOS transistor 32.

When the clock signal from the node "b" in the oscillator 20 is low level, the pumping capacitor 31 pumps the electric potential at the node "c" to −VCC. At first, the electric potential at the node "c" drops by −VCC+Vt1 (the threshold voltage Vt1 at the NMOS transistor 32) and is increased up to a threshold voltage Vt2 at the NMOS transistor 33, thus becoming −Vt2. At this time, the voltage VBB at the substrate is 0 V.

The charge pump 30 repeatedly performs a pumping operation in accordance with the clock signal from the oscillator 20. When the electric potential at the node "c" becomes −VCC+Vt1+Vt2, VSS>VBB+Vt1+Vt2 is obtained, and the NMOS transistors 12 and 13 are turned on. The oscillator 20 is not operated by a high level signal from the substrate voltage sensor 10, and the pumping operation is stopped.

FIG. 4 illustrates a related art data input/output terminal. The related art data input/output terminal includes NAND-gates 34 and 35. One input of NAND-gates 34 and 35 receives an enable signal EN, and the other inputs respectively receive output data DO and DOB. Inverters 36 and 37, respectively, invert the outputs from the NAND-gates 34 and 35. NMOS transistors 38 and 39 are coupled in series between the supply voltage VCC and the ground voltage VSS. The gates of the NMOS transistors 38 and 39 receive the outputs from the inverters 36 and 37, respectively. The body regions of the NMOS transistors 38 and 39 are coupled with the substrate voltage VBB.

When a low level voltage inputted into the data input/output terminal is reduced below −Vtn due to noise, etc., in a data write mode, the NMOS transistor 38 is turned on. Thus, a current Ids flows from VCC to the input/output terminal I/O. Therefore, a substrate current Isub is generated. The substrate current Isub is supplied to the substrate through the body region junction portion due to the current Ids, thus increasing the substrate voltage.

However, the related art substrate voltage generation circuit, operates in accordance with the substrate voltage sensing signal or the externally applied RASB signal. Then, an electric charge is supplied to the substrate. At this time, when increasing the driving capability of the substrate voltage generation circuit based on the current Isub at the data input/output terminal, the driving capability may be over-increased in the normal operation region, and the current consumption may be increased. In addition, the substrate voltage generation circuit is not stable with respect to a variation in the substrate voltage based on the current variation at the data input/output terminal.

SUMMARY OF THE INVENTION

An object of the present invention to substantially overcome at least the aforementioned problem encountered in the related art.

Another object of the present invention to provide an input/output voltage detection type substrate voltage generation circuit that prevents the electric potential of the substrate from being increased by varying the driving capability of a substrate voltage generation circuit by detecting an input electric potential of a data input/output terminal.

To achieve at least the above objects in whole or in parts, there is provided an input/output voltage detection type substrate voltage generation circuit according to the present invention, which includes a variable period type oscillator for receiving first, second and third signals as inputs and for varying the periods of the same, and a charge pump for pumping an electric charge to a substrate in accordance with a driving signal which is an output signal from the variable period type oscillator.

To further achieve the above objects, there is provided an input/output voltage detection type substrate voltage generation circuit according to the present invention, which includes a substrate voltage sensor for detecting a substrate voltage, a data I/O voltage detection unit for detecting a voltage at a data I/O terminal, a variable period type oscillator driven in accordance with a RASB signal or an output signal from the substrate voltage sensor for varying a period of a driving signal in accordance with an output signal from the data I/O voltage detection unit, and a charge pump for pumping an electric charge to a substrate in accordance with a period of the controlled driving signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
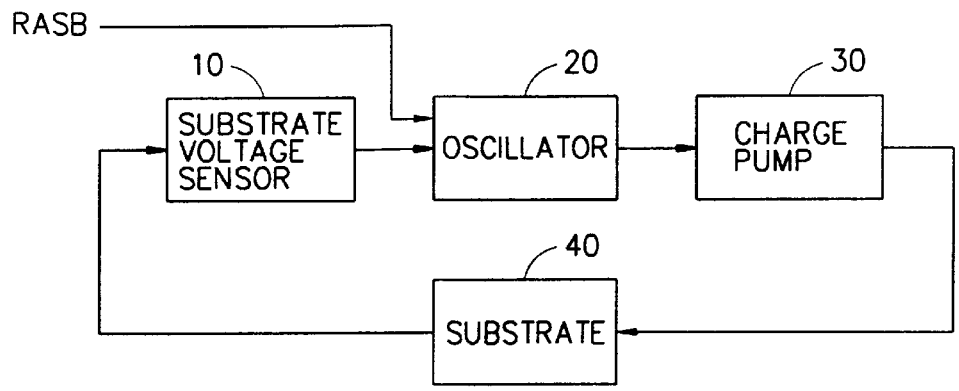
FIG. 1 is a block diagram illustrating a related art substrate voltage generation circuit.
Figure 2:
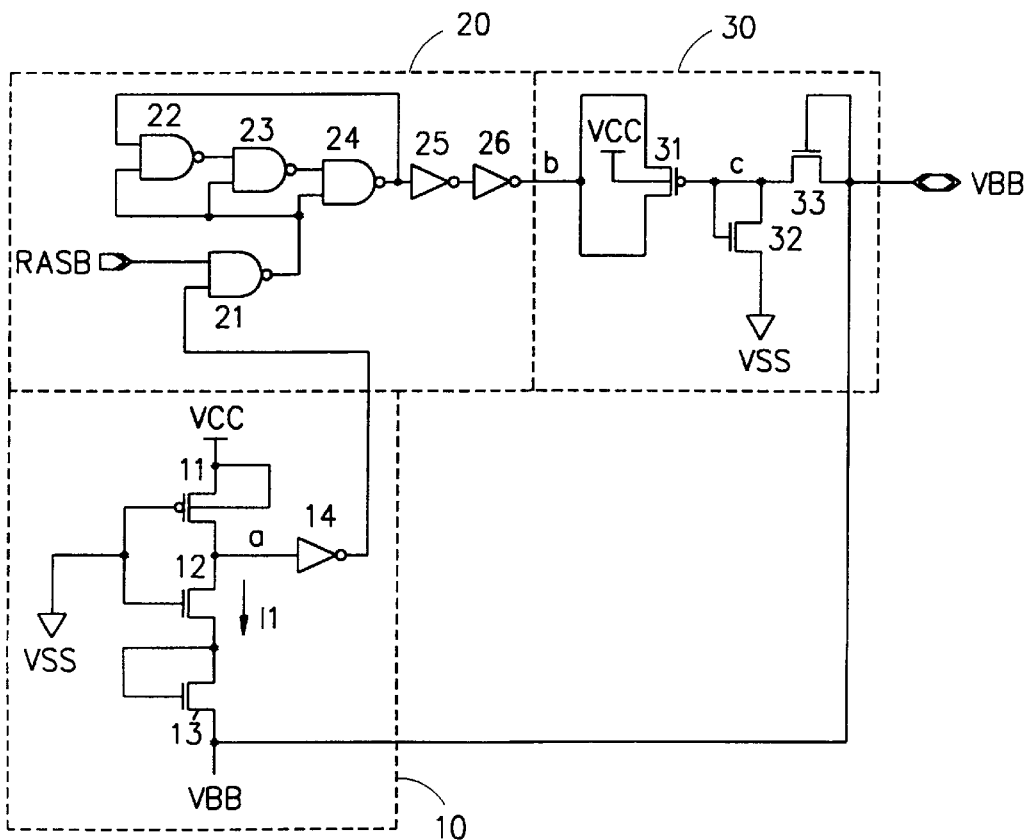
FIG. 2 is a circuit diagram illustrating the substrate voltage generation circuit of FIG. 1.
Figure 3A:
FIGS. 3A–3C are waveform diagrams showing waveforms of voltages in the circuit of FIG. 2.
Figure 3B:
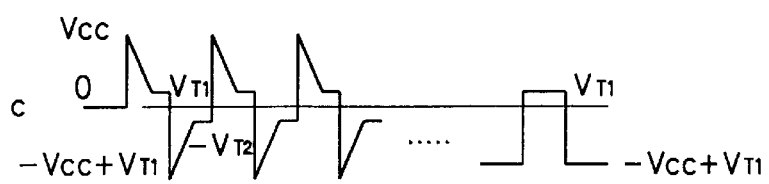
Figure 3C:
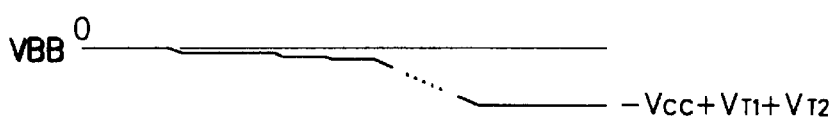
Figure 4:
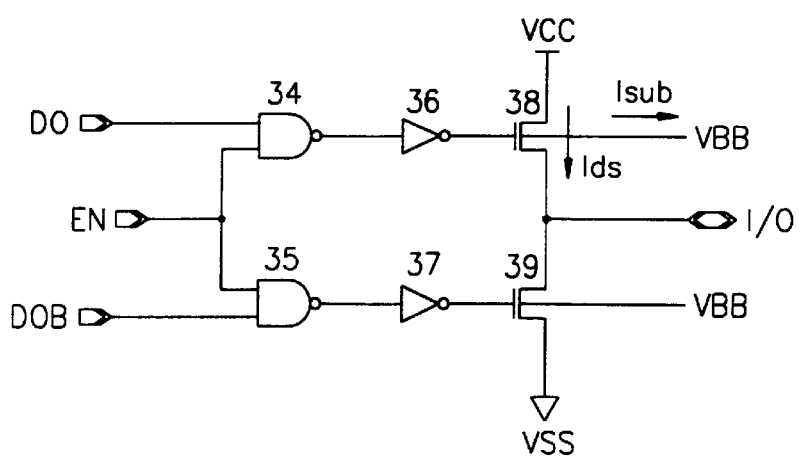
FIG. 4 is a circuit diagram illustrating a related art data input/output terminal.
Figure 5:
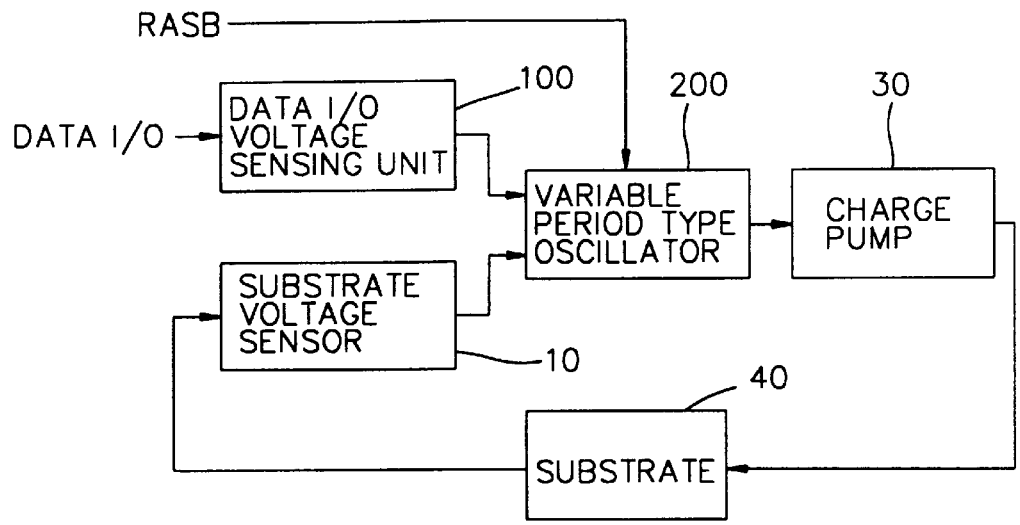
FIG. 5 is a block diagram illustrating a preferred embodiment of an input/output voltage detection type substrate voltage generation circuit according to the present invention.

FIG. 5 illustrates a preferred embodiment of an input/output voltage detection type substrate voltage generation circuit according to the present invention. As shown in FIG. 5, the preferred embodiment includes a data I/O voltage detection unit 100 for detecting a voltage of a data I/O terminal, and a variable period oscillator 200 that receives an externally applied RASB signal, an output from the data I/O voltage detection unit 100 and an output from the substrate voltage sensor 10. The variable period oscillator 200 varies the period of a clock signal. The preferred embodiment further includes the substrate 40, the substrate voltage sensor 10 and the charge pump 30 similar to the related art circuit shown in FIG. 1. Accordingly, a detailed description is omitted.

Figure 6:
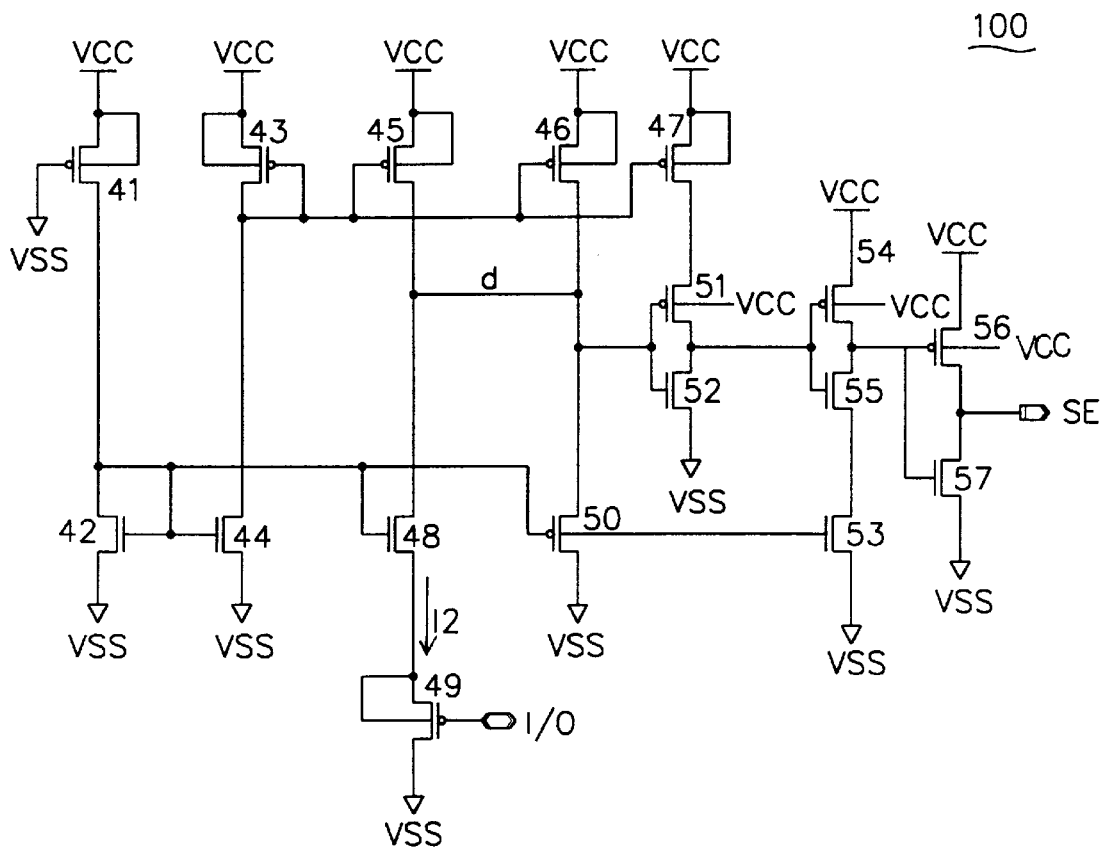
FIG. 6 is a circuit diagram illustrating a data input/output voltage detection unit of FIG. 5.

As shown in FIG. 6, the date I/O voltage detection unit 100 includes a PMOS transistor 49 having the source coupled to ground voltage VSS, the gate coupled to a data I/O terminal, and the drain coupled to its substrate body region. A first CMOS inverter is composed of a PMOS transistor 51 and an NMOS transistor 52 that respectively receive the drain voltage from the PMOS transistor 49 via a node "d" at their gates. A second CMOS inverter is composed of a PMOS transistor 54 and an NMOS transistor 55 that receive the output from the first CMOS inverter composed of the transistors 51, 52. A third CMOS inverter is composed of a PMOS transistor 56 and an NMOS transistor 57 for receiving the output from the second CMOS inverter and outputting a detection signal SE.

Figure 7:
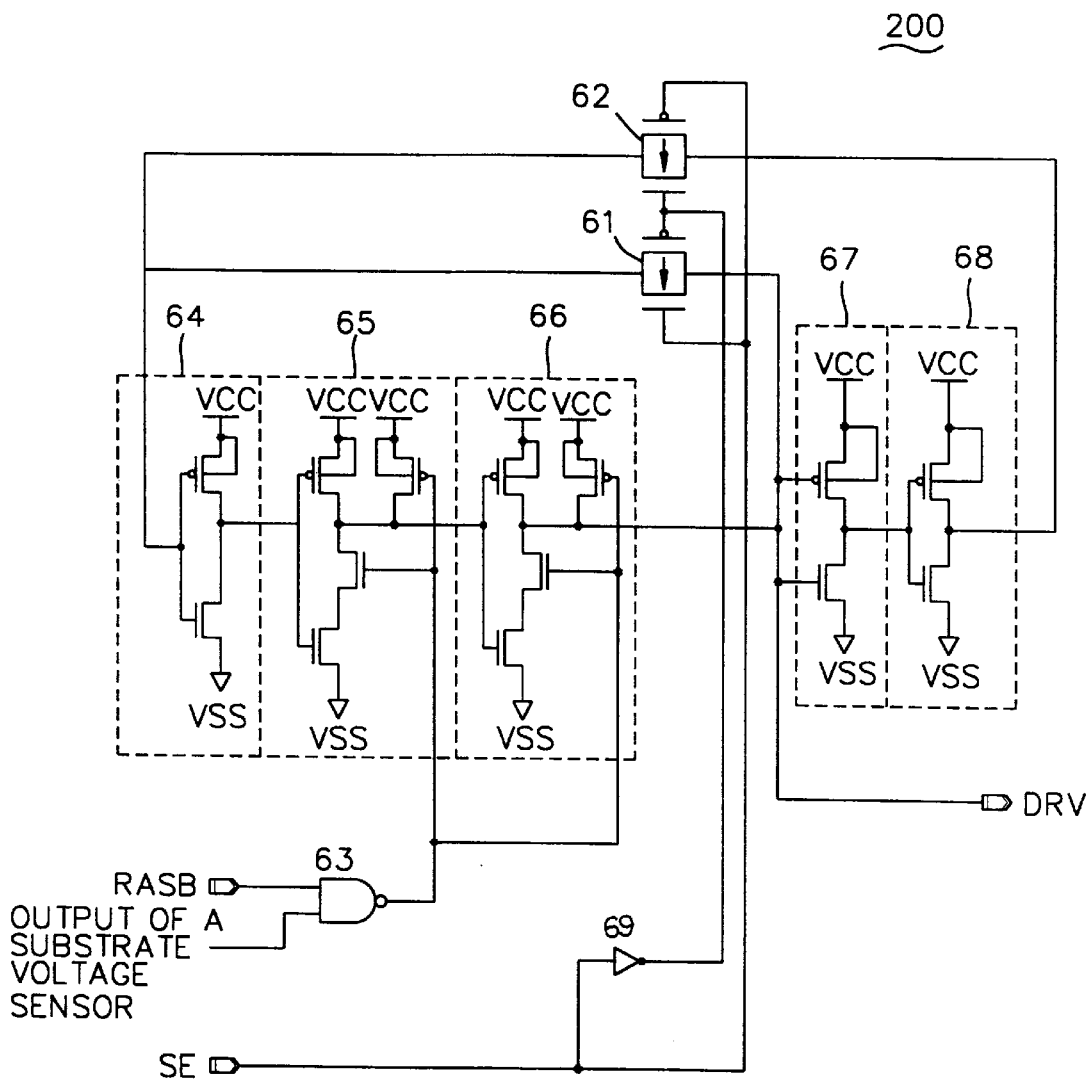
FIG. 7 is a circuit diagram illustrating a variable period type oscillator of FIG. 5.

As shown in FIG. 7, the variable period oscillator 200, includes first and second transmission gates 61 and 62 that operate based on the detection signal SE from the data I/O voltage detection unit 100 and the inverted detection signal from an inverter 69. A NAND-gate 63 is for NANDing the output signal from the substrate voltage sensor 10 and the externally inputted RASB signal. A fourth CMOS inverter 64 is for inverting the signal level of a driving signal DRV inputted through the first transmission gate 61. Fifth and sixth CMOS inverters 65 and 66 are driven by the output signal from the NAND-gate 63 to sequentially invert the output signal from the CMOS inverter 64 and output a new driving signal. A seventh CMOS inverter 67 is for inverting the signal level of the driving signal DRV. An eighth CMOS inverter 68 is for inverting the output signal from the seventh CMOS inverter 67 and transmitting the inverted output signal as an input signal of the fourth CMOS inverter 64 through the second transmission gate 62.

The fourth, seventh and eighth CMOS inverters 64, 67 and 68 are formed by a PMOS transistor and an NMOS transistor coupled in series between the power supply voltage VCC and ground voltage VSS, with their respective gates commonly coupled.

The fifth and sixth CMOS inverters 65 and 66 each include two PMOS transistors having their respective gates coupled to receive the output signal from the NAND-gate 63 and the output signal from the CMOS inverter of the previous stage. Further, the drains of the two PMOS transistors are commonly coupled. Two NMOS transistors are coupled in series between the drains of the PMOS transistors and the ground voltage VSS having respective gates coupled to receive the output signal from the NAND-gate 63 and the output signal of the CMOS inverter of the previous stage.

Operations of the preferred embodiment of the data input/output detection type substrate voltage generation circuit according to the present invention will now be described. The data I/O voltage detection unit 100 outputs a high level detection signal SE when the electric potential of the data I/O terminal drops below a predetermined level. The data I/O voltage detection unit 100 outputs a low level detection signal SE when the electrical potential of the data I/O terminal is above the predetermined level. The substrate voltage sensor 10 detects the substrate voltage VBB.

The variable period oscillator 200 is driven by the output signal from the substrate voltage sensor 10 and lengthens or shortens the period of the driving signal DRV to the charge pump 30 based on the output level from the data I/O voltage detection unit 100. Thus, the variable period oscillator 200 controls the pumping of the charge pump 30 so that the substrate voltage can be prevented from being increased within a short time.

Namely, when the electric potential at the data I/O terminal shown in FIG. 6 drops to −Vtp (Vtp denotes the threshold voltage of the PMOS transistor 49), the PMOS transistor 49 is turned on. Thus, the current I2 flows. At this time, NMOS transistors 42, 44 and 48 and the PMOS transistors 41, 43, 45, 46 and 47 remain turned-on.

Therefore, when the electric potential at the node "d" drops, the PMOS transistor 51 is turned on. Thus, the NMOS transistor 55 and the PMOS transistor 56 are sequentially turned on, and a high level detection signal SE at the high level power supply voltage VCC is outputted through the output terminal. In addition, when the electric potential at the data I/O terminal exceeds −Vtp, a low level detection signal SE is outputted through the output terminal.

When the electric potential at the data I/O terminal drops to −Vtp, a high level detection signal SE is outputted from the data I/O voltage detection unit 100. As shown in FIG. 7, the first transmission gate 61 is turned on, and a period determination path of the driving signal DRV from the variable period oscillator 200 is formed. The period determination path of the driving signal DRV is formed in a three-tier structure (e.g., by the fourth, fifth and sixth CMOS inverters 64, 65 and 66) so that the driving capability of the substrate voltage generation circuit is increased.

When a low level external RASB signal is inputted, or the substrate voltage VBB increased, (e.g., when a low level signal is outputted from the substrate voltage sensor 10) the NAND-gate 63 outputs a high level signal to drive the fifth and sixth CMOS inverters 65 and 66. Therefore, the driving signal DRV, which maintains a high level or low level, is sequentially inverted by the fourth, fifth and sixth CMOS inverters 64, 65 and 66 through the first transmission gate 61 and then is outputted, so that the period of the driving signal DRV is shortened.

On the contrary, when the electric potential at the data I/O terminal exceeds −Vtp, a low level detection signal SE is outputted from the data I/O voltage detection unit 100. The second transmission gate 62 is turned on, and the period determination path of the driving signal DRV from the variable period oscillator 200 is formed in a five-tier structure. Namely, the period determination path is formed by the by the fourth, fifth, sixth, seventh and eighth CMOS inverters 64, 65, 66, 67, and 68.

Therefore, the driving signal DRV, which maintains a high level or low level, is sequentially inverted by the fourth, fifth, sixth, seventh and eighth CMOS inverters 64, 65, 66, 67, and 68. The driving signal DRV then is transmitted through the second transmission gate 62 and is outputted. Thus, the period of the driving signal DRV is extended (lengthened).

The charge pump 30 increases the number of charge pumpings when the period of the driving signals DRV is shorter in accordance with the driving signal DRV from the variable period oscillator 200. The charge pump 30 decreases the number of charge pumpings when the period is longer.

Finally, in the preferred embodiment, when the substrate voltage begins to increase, the period of the driving signal DRV from the variable period oscillator 200 is shortened, which increases the number of charge pumpings within a unit time. Thus, the substrate voltage can be prevented from increasing.

As described above in the preferred embodiment, the circuit is driven based on the externally inputted RASB signal or the substrate voltage (VBB) detection signal. Accordingly, the driving capability of the voltage generation circuit is increased only when the electric potential at the data I/O terminal drops. Thus, the preferred embodiment of the circuit can efficiently reduce the current consumption.

In addition, the preferred embodiment more quickly responds to variations in the substrate voltage caused by electrical variation at the data I/O terminal. Thus, the preferred embodiment more quickly stabilizes the increased substrate voltage by directly detecting the electric potential at the data I/O terminal and controls the number of charge pumping operations in accordance with the varied driving signal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A substrate voltage generation circuit, comprising:
   a variable period type oscillator that receives a first, second and third input signals, wherein the second input signal is a substrate voltage signal and the third signal is an I/O voltage detection signal, and wherein a period of the variable period type oscillator is based on the input signals; and
   a charge pump that pumps an electric charge for transmission to a substrate based on a driving signal output from the variable period type oscillator.

2. The circuit of claim 1, wherein the first signal is a RASB signal.

3. The circuit of claim 1, wherein the variable period type oscillator is driven when the first and second signals are low level.

4. The circuit of claim 1, wherein the variable period type oscillator varies the period of the driving signal in accordance with the third signal.

5. The circuit of claim 4, wherein the period of the driving signal is shorter when the third signal is a high level.

6. The circuit of claim 5, wherein the driving signal is outputted through a five-tiered structure period determination path including five series coupled inverters when the third signal is low level, and the driving signal is outputted from a three-tiered structure period determination path including three series coupled inverters when the third signal is a high level.

7. The circuit of claim 2, wherein the third signal is a high level detection signal when a data I/O voltage is detected to be lower than a predetermined voltage and is a low level detection signal when the data I/O voltage is detected to be higher than the predetermined voltage.

8. The circuit of claim 2, further comprising:
- a transistor having a first electrode coupled with a reference voltage, a control electrode coupled with a data I/O voltage, and a second electrode coupled with the substrate;
- a first inverter that receives an electric potential of the second electrode of the transistor;
- a second inverter that receives an output from the first invertor; and
- a third inverter that receives an output from the second inverter, wherein the third signal is outputted from the third inverter.

9. The circuit of claim 2, wherein the variable period type oscillator comprises:
- a logic-gate that receives the first and second signals to output a control signal;
- first and second transmission gates that operate based on the third signal and an inverted third signal;
- a first inverter that receives outputs from the first and second transmission gates;
- a second inverter that inverts an output from the first inverter based on the control signal;
- a third inverter that inverts an output from the second inverter based on the control signal;
- a fourth inverter that receives an output from the third inverter; and
- a fifth inverter that receives an output from the fourth inverter, wherein the first and second transmission gates respectively receive outputs from the third and fifth inverters and the driving signal is output by the third inverter.

10. A substrate voltage generation circuit, comprising:
- a substrate voltage sensor that detects a substrate voltage;
- a data I/O voltage detector that detects a voltage at a data I/O terminal;
- a variable period type oscillator driven based on at least one of a row address strobe (RASB) signal and an output signal from the substrate voltage sensor to vary a period of a driving signal in accordance with an output signal from the data I/O voltage detector; and
- a charge pump for pumping an electric charge to a substrate based on the driving signal.

11. The circuit of claim 10, wherein the variable period type oscillator is driven when the RASB signal and the output signal from the substrate voltage sensor signals are low level.

12. The circuit of claim 10, wherein the driving signal period is shorter when a detection signal from the data I/O voltage detector is high level.

13. The circuit of claim 12, wherein the driving signal is outputted through a first period determination path when the third signal is low level, and the driving signal is outputted from a second period determination path when the third signal is a high level, wherein the first period determination path is longer than the second period determined path.

14. The circuit of claim 13, wherein the first period determination path includes at least five series coupled logic gates and the second period determination path includes at least three series-coupled logic gates.

15. The circuit of claim 10, wherein the third signal is a high level detection signal when a data I/O voltage is detected to be lower than a predetermined voltage and is a low level detection signal when the data I/O voltage is detected to be higher than the predetermined voltage.

16. The circuit of claim 10, further comprising:
- a transistor having a first electrode coupled with a reference voltage control electrode copled with a data I/O voltage, and a second electrode coupled with the substrate;
- a first inverter that receives an electric potential of the second electrode of the transistor;
- a second inverter that receives an output from the first invertor; and
- a third inverter that receives an output from the second inverter, wherein the third signal is outputted from the third inverter.

17. The circuit of claim 10, wherein the variable period type oscillator comprises:
- logic-gate that receives the first and second signals to output a control signal;
- first and second transmission gates that operate based on the third signal and an inverted third signal;
- a first inverter that receives outputs from the first and second transmission gates;
- a second inverter that inverts an output from the first inverter based on the control signal;
- a third inverter that inverts an output from the second inverter based on the control signal;
- a fourth inverter that receives an output from the third inverter; and
- a fifth inverter that receives an output from the fourth inverter, wherein the first and second transmission gates respectively receive outputs from the third and fifth inverters and the driving signal is output by the third inverter.

18. A voltage generator, comprising:
- a variable period oscillator that receives a first signal, a reference voltage signal, and a data voltage detection signal, wherein a period of the variable period type oscillator is based on the three received signals; and
- a pumping circuit that pumps a voltage based on a driving signal output from the variable period oscillator.

19. The voltage generator of claim 18, further comprising a data terminal that outputs the data voltage detection signal, wherein the data voltage detection signal is a first level when a data voltage at the data terminal is less than a predetermined voltage and is a second level when the data voltage is higher than the predetermined voltage, and wherein the first and second levels are different.

20. The voltage generator of claim 18, wherein the driving signal is outputted through a first period determination path when the data voltage detection signal is a first level and the driving signal is outputted from a second period determination path when the data voltage detection signal is a second level, and wherein the first period determination path is longer than the second period determination path.

* * * * *